(12) United States Patent
Harper et al.

(10) Patent No.: US 9,837,368 B2
(45) Date of Patent: Dec. 5, 2017

(54) ENHANCED BOARD LEVEL RELIABILITY FOR WAFER LEVEL PACKAGES

(71) Applicant: Maxim Integrated Products, Inc., San Jose, CA (US)

(72) Inventors: Peter R. Harper, Gilroy, CA (US); Martin Mason, San Jose, CA (US); Arkadii V. Samoilov, Saratoga, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

(21) Appl. No.: 14/496,049

(22) Filed: Sep. 25, 2014

(65) Prior Publication Data

US 2015/0255413 A1 Sep. 10, 2015

Related U.S. Application Data

(60) Provisional application No. 61/947,538, filed on Mar. 4, 2014.

(51) Int. Cl.
*H01L 23/00* (2006.01)
*H01L 23/31* (2006.01)
*H01L 21/56* (2006.01)

(52) U.S. Cl.
CPC .......... *H01L 24/14* (2013.01); *H01L 23/3135* (2013.01); *H01L 23/3192* (2013.01); *H01L 24/03* (2013.01); *H01L 24/05* (2013.01); *H01L 24/81* (2013.01); *H01L 21/561* (2013.01); *H01L 24/16* (2013.01); *H01L 24/32* (2013.01); *H01L 2224/0346* (2013.01); *H01L 2224/0384* (2013.01); *H01L 2224/0391* (2013.01); *H01L 2224/03334* (2013.01); *H01L 2224/0401* (2013.01); *H01L 2224/04026* (2013.01);

(Continued)

(58) Field of Classification Search
CPC ............. H01L 23/5389; H01L 23/3114; H01L 23/49822; H01L 23/28; H01L 23/3107; H01L 24/14; H01L 24/81; H01L 2924/0105; H01L 2924/0695; H01L 2924/01029; H01L 2924/0665; H01L 2924/0645; H01L 2224/85
See application file for complete search history.

(56) References Cited

U.S. PATENT DOCUMENTS

2004/0238973 A1\* 12/2004 Wakisaka et al. ............ 257/796
2009/0072391 A1\* 3/2009 Kolan et al. ................. 257/737

(Continued)

*Primary Examiner* — Marc Armand
*Assistant Examiner* — Sue Tang
(74) *Attorney, Agent, or Firm* — Advent, LLP

(57) ABSTRACT

A wafer level package device, electronic device, and fabrication methods for fabrication of the wafer level package device are described that include forming an exposed lead tip on the wafer level package for providing a solder buttress structure when coupling the wafer level package device to another electrical component. In implementations, the wafer level package device includes at least one integrated circuit die, a metal pad, a first dielectric layer, a redistribution layer, a second dielectric layer, a pillar structure, a molding layer, a pillar layer, and a plating layer, where the pillar layer is sawn to form pad contacts on at least two sides of the wafer level package device. The exposed pad contact facilitate a solder fillet and buttress structure resulting in improved board level reliability.

17 Claims, 7 Drawing Sheets

(52) U.S. Cl.
CPC ........... *H01L 2224/04105* (2013.01); *H01L 2224/05005* (2013.01); *H01L 2224/05541* (2013.01); *H01L 2224/05568* (2013.01); *H01L 2224/05571* (2013.01); *H01L 2224/05611* (2013.01); *H01L 2224/131* (2013.01); *H01L 2224/161* (2013.01); *H01L 2224/16058* (2013.01); *H01L 2224/291* (2013.01); *H01L 2224/321* (2013.01); *H01L 2224/32058* (2013.01); *H01L 2224/85* (2013.01); *H01L 2224/94* (2013.01); *H01L 2924/0105* (2013.01); *H01L 2924/01029* (2013.01); *H01L 2924/0645* (2013.01); *H01L 2924/0665* (2013.01); *H01L 2924/0695* (2013.01); *H01L 2924/181* (2013.01)

(56) References Cited

U.S. PATENT DOCUMENTS

| | | | | |
|---|---|---|---|---|
| 2009/0236738 | A1* | 9/2009 | Shim et al. | 257/737 |
| 2011/0193220 | A1* | 8/2011 | Kuo et al. | 257/737 |
| 2011/0227219 | A1* | 9/2011 | Alvarado | H01L 24/03 257/738 |
| 2013/0062755 | A1* | 3/2013 | Kuo et al. | 257/737 |
| 2014/0084435 | A1* | 3/2014 | Kimura | H01L 23/49548 257/676 |

* cited by examiner

ENHANCED BOARD LEVEL RELIABILITY FOR WAFER LEVEL PACKAGES

BACKGROUND

Over the years, packaging technologies have evolved to develop smaller, cheaper, more reliable, and more environmentally-friendly packages. For example, chip-scale packaging technologies have been developed that employ direct surface mountable packages. Flat no-lead packaging technologies, such as quad-flat no-leads (QFN) packaging technologies, physically and electrically connect integrated circuit chips to printed circuit boards. Flat no-lead packaging technologies typically employ a lead-frame that includes an integrated circuit chip (die) mounted thereon. The die may be electrically interconnected with the lead-frame through wire-bonding technology or flip-chip technology.

SUMMARY

A wafer level package, electronic device, and fabrication methods are described that include forming an exposed lead tip on the wafer level package for providing a solder buttress structure on the wafer level package. The solder fillet can be optimized to enhance board level reliability and provide for easy visual inspection. In implementations, the wafer level device that employs example techniques in accordance with the present disclosure includes a processed semiconductor wafer including at least one integrated circuit die, a metal pad disposed on the at least one integrated circuit die, a first dielectric layer disposed on the at least one integrated circuit die and at least a portion of the metal pad, a redistribution layer at least partially formed on the metal pad and the first dielectric layer, a second dielectric layer disposed on the first dielectric layer and a portion of the redistribution layer, a first pillar formed on the redistribution layer, a molding layer formed at least partially on the second dielectric layer, a second pillar formed on the first pillar, and a plating layer formed on the second pillar. Additionally, an electronic device can include a printed circuit board and a wafer level device as described above. In implementations, one process for fabricating the surface mount device that employs example techniques in accordance with the present disclosure includes receiving a processed integrated circuit wafer, forming a metal pad on the processed integrated circuit wafer, forming a first dielectric layer on at least a portion of the integrated circuit wafer and at least a portion of the metal pad, forming a redistribution layer structure on at least a portion of the metal pad and the first dielectric layer, forming a second dielectric layer on the first dielectric layer and a portion of the redistribution layer structure, forming a pillar on the redistribution layer structure, forming a molding layer on the second dielectric layer and a portion of the pillar, forming a pillar layer on the pillar and a portion of the molding layer, where the pillar layer extends from a first pillar to another pillar, forming a plating layer on the pillar layer, and singulating the processed integrated circuit wafer including cutting along a saw street that crosses the plating layer, where singulating the processed integrated circuit results in a wafer level package with pad contacts exposed on at least two sides of the wafer level package.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The detailed description is described with reference to the accompanying figures. The use of the same reference numbers in different instances in the description and the figures may indicate similar or identical items.

DETAILED DESCRIPTION

Overview

Figure 1A:
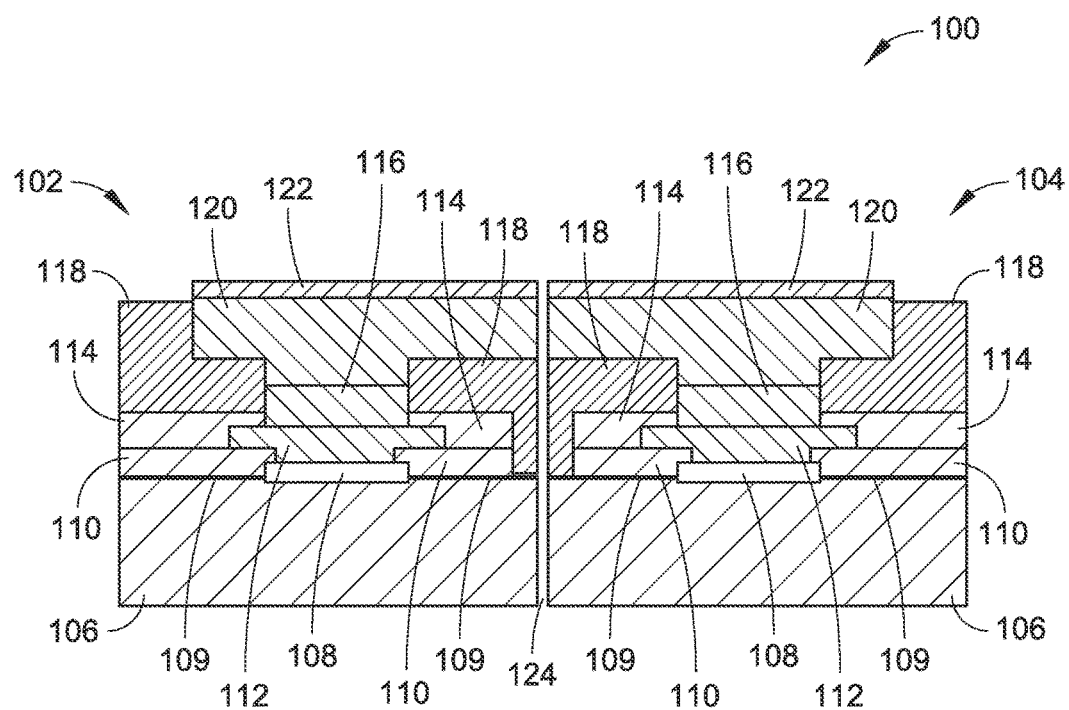
FIG. 1A is a diagrammatic cross-sectional view illustrating an embodiment of a wafer level package that includes an exposed lead tip, in accordance with an example implementation of the present disclosure.

Wafer-level packaging is a chip-scale packaging technology that encompasses a variety of techniques whereby integrated circuit chips are packaged at wafer level, prior to segmentation. Wafer-level packaging extends the wafer fabrication processes to include device interconnection and device protection processes. Consequently, wafer-level packaging streamlines the manufacturing process by allowing for the integration of wafer fabrication, packaging, testing, and burn-in processes at the wafer level.

Devices that employ flat no-lead packaging technologies, such as QFN packaging technologies, provide good mechanical protection to the integrated circuit chips (dies)

contained within the device packages by fully encapsulating the integrated circuit chips within the package. However, flat no-lead (e.g., QFN) package devices may be expensive to produce and may typically provide relatively low pin counts (e.g., the pins of a QFN are typically located along the bottom edge). QFN packages can be coupled to other devices, such as using a solder connection to couple the package to a printed circuit board. However, the solder joint of a wafer level QFN to other devices is often not inspectable and can result in reduced board level reliability when compared to a leadframe QFN with a solder buttress.

Accordingly, a wafer level package, electronic device, and fabrication methods are described that include forming an exposed lead tip on the wafer level package for providing a solder buttress structure on the wafer level package. The solder fillet can be optimized to enhance board level reliability and provide for easy visual inspection. In implementations, the wafer level device that employs example techniques in accordance with the present disclosure includes a processed semiconductor wafer including at least one integrated circuit die, a metal pad disposed on the at least one integrated circuit die, a first dielectric layer disposed on the at least one integrated circuit die and at least a portion of the metal pad, a redistribution layer at least partially formed on the metal pad and the first dielectric layer, a second dielectric layer disposed on the first dielectric layer and a portion of the redistribution layer, a first pillar formed on the redistribution layer, a molding layer formed at least partially on the second dielectric layer, a second pillar formed on the first pillar, and a plating layer formed on the second pillar. Additionally, an electronic device can include a printed circuit board and a wafer level device as described above. In implementations, one process for fabricating the surface mount device that employs example techniques in accordance with the present disclosure includes receiving a processed integrated circuit wafer, forming a metal pad on the processed integrated circuit wafer, forming a first dielectric layer on at least a portion of the integrated circuit wafer and at least a portion of the metal pad, forming a redistribution layer structure on at least a portion of the metal pad and the first dielectric layer, forming a second dielectric layer on the first dielectric layer and a portion of the redistribution layer structure, forming a pillar on the redistribution layer structure, forming a molding layer on the second dielectric layer and a portion of the pillar, forming a pillar layer on the pillar and a portion of the molding layer, where the pillar layer extends from a first pillar to another pillar, forming a plating layer on the pillar layer, and singulating the processed integrated circuit wafer including cutting along a saw street that crosses the plating layer, where singulating the processed integrated circuit results in a wafer level package with pad contacts exposed on at least two sides of the wafer level package.

Example Implementations

FIGS. 1A through 1D illustrate a wafer level package device 100 in accordance with an example implementation of the present disclosure. As shown in FIG. 1A, the wafer level package device 100 can include an integrated circuit die 106. In implementations, the integrated circuit die 106 can include at least one integrated circuit die 106 that has been formed from and/or as a portion of a processed semiconductor wafer. The integrated circuit die 106 may include digital integrated circuits, analog integrated circuits, mixed-signal circuits, and so forth. In one or more implementations, the integrated circuit die 106 may include digital logic devices, analog devices (e.g., amplifiers, etc.), and combinations thereof, etc. In the implementation illustrated in FIG. 1A, a portion of a processed semiconductor wafer is shown including a first integrated circuit die package 102 and a second integrated circuit die package 104.

As described above, the integrated circuit die 106 may be fabricated utilizing various fabrication techniques. For example, the integrated circuit die 106 may be fabricated via complimentary metal-oxide-semiconductor (CMOS) techniques, bi-polar semiconductor techniques, and so on. The integrated circuit die 106 may include electrical interconnections formed therein (e.g., integrated circuits, redistribution layers, vias, contact pads, etc.). In implementations, the integrated circuit die 106 can include an active die (e.g., a processor) and/or a passive die (e.g., a capacitor, a transistor, etc.). Additionally, the integrated circuit die 106 can include and/or be configured to couple to electrical interconnections (e.g., contacts pads, metal pads, such as copper and/or aluminum, under-ball metallization (UBM), etc.) configured to provide an electrical connection between the integrated circuit die 106 (by way of a redistribution layer, vias, and/or other electrical interconnections) and an external component (e.g., a printed circuit board 130).

As illustrated in FIG. 1A, the wafer level package device 100 includes a metal pad 108 formed on the integrated circuit die 106. In implementations, the metal pad 108 can be configured to provide an electrical contact between the integrated circuit die 106 and other metal routing, such as a pillar and/or redistribution routing (e.g., a redistribution layer structure 112). In a specific embodiment, a metal pad 108 includes an aluminum pad formed on the integrated circuit die 106. In other embodiments, the metal pad 108 can include other metals besides aluminum, such as copper. The metal pad 108 can be formed using processes, such as deposition (e.g., physical, chemical, plating, etc.).

The wafer level package device 100 includes a dielectric layer 109 and a dielectric layer 110. As shown in FIG. 1A, dielectric layer 109 is formed on the surface of a processed semiconductor wafer with at least one integrated circuit die 106 formed therein. In one specific embodiment, the dielectric layer 109 can include a combination of silicon dioxide ($SiO_2$) and silicon nitride ($Si_3N_4$). It is contemplated that other dielectric materials can be used to form dielectric layer 109, such as PBO, etc. As illustrated in FIG. 1A, the dielectric layer 110 can be formed on a surface of the processed semiconductor wafer and/or dielectric layer 109. Additionally, the dielectric layer 110 can be disposed against and covering a portion of the metal pad 108 and/or dielectric layer 109. In some embodiments, dielectric layer 109 and dielectric layer 110 can be formed using the same or a similar material and/or formed using the same process step. In a specific embodiment, the dielectric layer 110 can be formed (e.g., by coating or deposition) over the processed semiconductor wafer and metal pad 108 and later etched to expose at least a portion of the metal pad 108. The dielectric layer 109 and/or the dielectric layer 110 can function as an electrical insulation between the integrated circuit die 106, metal pads 108 and other electrical devices. In some implementations, the dielectric layer 110 can include a benzocyclobutene (BCB) polymer material, a polyimide (PI) material, a polybenzoxazole (PBO) material, an oxide material (e.g., silicon dioxide ($SiO2$)), and/or combinations thereof, etc. In one specific embodiment, the dielectric layer 110 includes polybenzoxazole (PBO).

Shown in FIG. 1A, the wafer-level package device 100 further includes a redistribution layer structure 112 formed on the metal pad 108 and a portion of the dielectric layer 110. In implementations, the redistribution layer structure 112 functions as a rerouting and interconnection system serving to redistribute electrical interconnections within the wafer-level package device 100. The redistribution layer structure 112 can electrically interconnect a conductive pad (e.g., the metal pad 108) with another component (e.g., a solder bump, not shown). Additionally, the redistribution layer structure 112 may also include other related interconnection components, such as under-bump metallization (UBM), contact pads, metal lines and/or routing, etc. In a specific embodiment, the redistribution layer structure 112 can include a titanium (Ti) barrier layer and a copper (Cu) seed, which is electroplated to full thickness to form metal lines and/or a conductive pad adjacent to and abutting metal pad 108. As shown in FIG. 1A, another (a second) dielectric layer 114 can be formed on the first dielectric layer 110 and a portion of the redistribution layer structure 112 in a similar fashion as first dielectric layer 110 described above, where the dielectric layer 114 can be formed over at least part of the redistribution layer structure 112 and subsequently etched and/or removed to expose at least a portion of the redistribution layer structure 112. In embodiments, the dielectric layer 114 can include a benzocyclobutene (BCB) polymer material, a polyimide (PI) material, a polybenzoxazole (PBO) material, an oxide material (e.g., silicon dioxide (SiO2)), other electrically insulating materials, and/or combinations thereof, etc. In one specific embodiment, the dielectric layer 114 includes polybenzoxazole (PBO).

Next, pillar structure 116 can be disposed on a portion of the redistribution layer structure 112, as shown in FIG. 1A. In implementations, the pillar structure 116 can be formed on a portion of the redistribution layer structure 112 that has had a portion of the dielectric layer 114 removed, which provides suitable electrical contact between the redistribution layer structure 112 and the pillar structure 116. A pillar structure 116 can include a structure that extends from the redistribution layer structure 112 and functions to create standoff from the redistribution layer structure 112. In some implementations, the pillar structure 116 can include a barrier layer of titanium (or titanium/tungsten) and/or electroplated copper, aluminum, or other conductive metal.

In implementations, a pillar layer 120 is disposed on the pillar structure 116. As illustrated in FIG. 1A, the pillar layer 120 can overlap a first pillar structure 116 and extend across a saw street 124 (before sawing and singulation) to another (e.g., second) pillar structure 116. In one implementation, the pillar layer 120 can include a barrier material (e.g., titanium, titanium/tungsten, etc.), aluminum, and/or copper. The pillar layer 120 may overlap each pillar structure 116, for example the partial cantilever configuration shown in FIG. 1A. In implementations, the pillar layer 120 is sawn through during the singulation process, and the side of the pillar layer 120 exposed from the singulation process results in an exposed lead tip, which can provide increased surface area for solder 126 to adhere and form a solder fillet, further providing solder connection strength and improved board level reliability.

As illustrated in FIG. 1A, the wafer level package device 100 includes a molding layer 118. In implementations, the molding layer 118 can include plastic molding compounds which may further include composite materials such as, for example, epoxy resins, phenolic hardeners, silicas, catalysts, pigments, thermoset resins, and mold release agents. In one specific embodiment, the molding layer 118 includes an epoxy-based material. The molding layer 118 can be formed on the dielectric layer 114 and surrounding and/or under the pillar structure 116 and pillar layer 120. In implementations, the molding layer 118 can serve to electrically insulate and mechanically support and protect the pillar structure 116 and the pillar layer 120. Molding compounds used for the molding layer 118 utilized in the wafer level package device 100 may be selected to have a low moisture absorption rate, a high flexural strength at board-mounting temperatures, or a combination of both. In implementations, the molding layer 118 can be formed using processes such as injection molding, filling and curing with a thermoset resin, compression molding, transfer molding, etc.

Figure 1B:
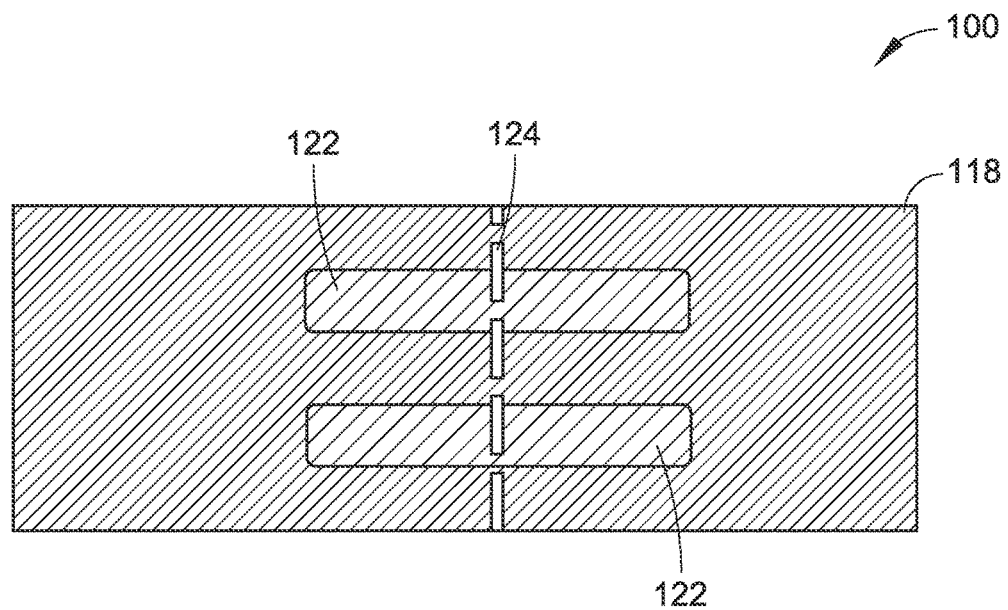
FIG. 1B is a partial bottom plan view illustrating an embodiment of a wafer level package that includes an exposed lead tip, in accordance with an example implementation of the present disclosure.

Subsequent to forming a molding layer 118, a plating layer 122 can be formed on a surface of the pillar layer 120. As shown in FIGS. 1A and 1B, the plating layer 122 can be formed on the exposed surface of the pillar layer 120. FIG. 1B shows a top plan view of the wafer level package device 100 illustrating the plating layer 122 formed on the pillar layer 120 and the molding layer 118. Here, a saw street 124 is illustrated through multiple plating layers 122, which, when sawn and singulated, form a first integrated circuit die package 102 and a second integrated circuit die package 104. Additional integrated circuit die packages can be formed using this technique, even though only two integrated circuit die packages are illustrated.

In implementations, the plating layer 122 can include materials that suited for soldering, for example lead-free metals such as a Tin-Silver-Copper (Sn—Ag—Cu) alloy (i.e., SAC), a Tin-Silver (Sn—Ag) alloy, a Tin-Copper (Sn—Cu) alloy, etc. In one specific embodiment, a Tin-Lead (PbSn) material may be used as the plating layer 122. The plating layer 122 can be formed such that it is flush with the surface of the molding layer 118 or such that it is offset from the molding layer 122, as shown in FIG. 1A.

Figure 1C:
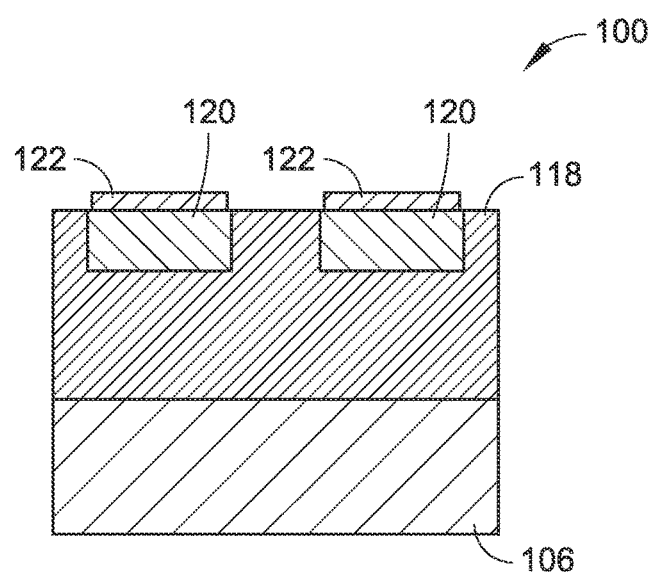
FIG. 1C is a partial cross section view illustrating an embodiment of a wafer level package that includes an exposed lead tip, in accordance with an example implementation of the present disclosure.

FIG. 1C illustrates a side elevation view of a singulated wafer level package device 100. As can be viewed in FIG. 1C, a side view of the wafer level package device 100, the singulated wafer level package device 100 includes an integrated circuit die 106, a molding layer 118, and a sawn plating layer 122 that forms an exposed lead tip. The exposed lead tip is configured to adhere to solder 126 such that the solder 126 connection forms a solder fillet resulting in a strengthened solder connection and increased board level reliability.

Figure 1D:
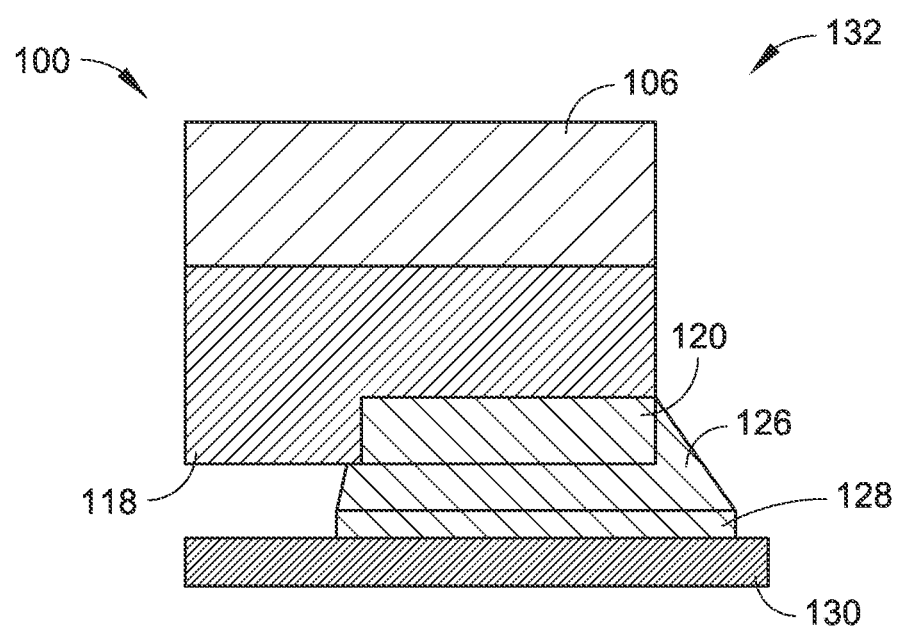
FIG. 1D is a partial cross section view illustrating an embodiment of a wafer level package that includes an exposed lead tip, where the wafer level package is coupled to a printed circuit board, in accordance with an example implementation of the present disclosure.

FIG. 1D illustrates a partial view of an exemplary electronic device 132 including a wafer level package device 100 that is coupled to a printed circuit board 130 using solder 126 and a solder pad 128. As illustrated in FIG. 1D, the solder 126 adheres to a sawn pillar layer 120 (exposed lead tip) on the bottom of the wafer level package device 100 (e.g., the side distal from the integrated circuits) and the exposed pillar layer 120 on the side of the wafer level package device 100 (e.g., with the surface of the pillar layer 120 resulting from the singulation process). In this example, solder 126 is in contact with multiple sides of the sawn pillar layer 120 (e.g., the side exposed from sawing and the plating layer 122). This configuration results in a solder fillet and a solder buttress structure.

Example Processes

Figure 2:
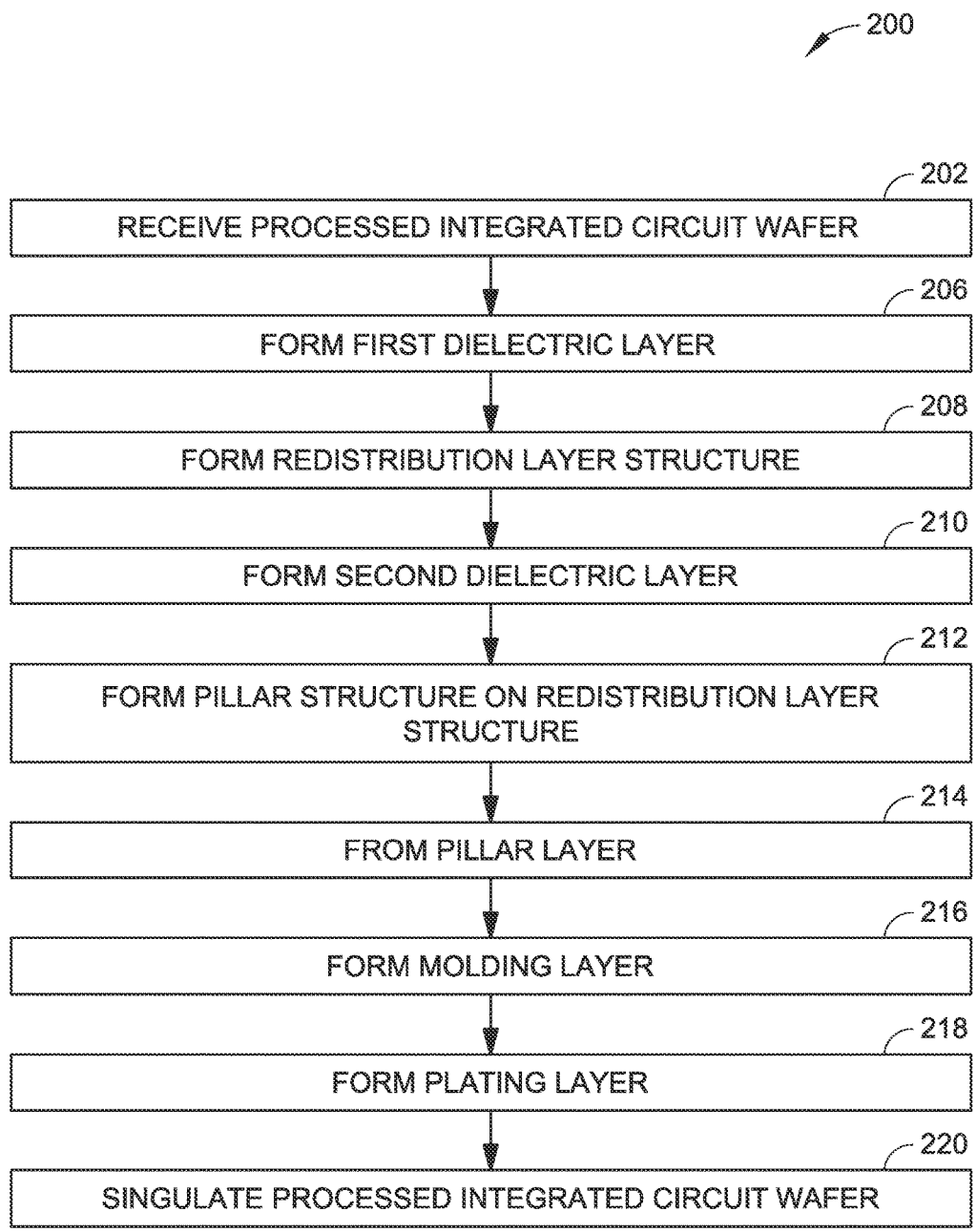
FIG. 2 is a flow diagram illustrating an example process for fabricating a wafer level package that includes an exposed lead tip, such as the surface mount devices illustrated in FIGS. 1A through 1D.

FIG. 2 illustrates an example process 200 that employs semiconductor packaging techniques to fabricate a wafer level package device with an exposed lead tip, such as the wafer level package device 100 shown in FIGS. 1A through 1D. FIGS. 3A through 3E illustrate a section of a processed semiconductor wafer 334 during fabrication of an example wafer level package device 300 (such as the wafer level package device 100 shown in FIGS. 1A through 1D).

Figure 3A:
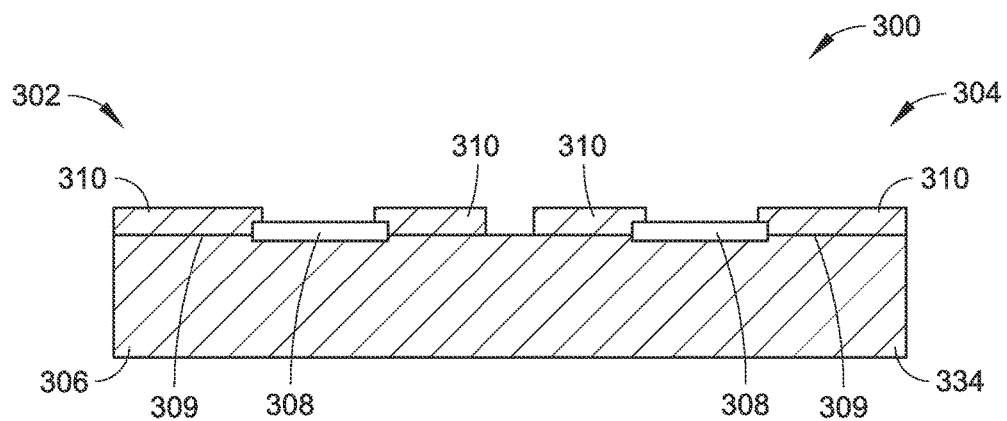
FIG. 3A is a diagrammatic partial cross-sectional side elevation view illustrating the fabrication of a wafer level package, such as the device shown in FIGS. 1A through 1D, in accordance with the process shown in FIG. 2.

In the process 200 illustrated, a processed integrated circuit wafer and integrated circuit die are received (Block 202). As shown in FIG. 3A, receiving a processed semiconductor wafer 334 can include receiving a processed semiconductor wafer that has been processed to form one or more integrated circuits (e.g., a first integrated circuit die package 302, second integrated circuit die package 304, etc.). In some implementations, the processed semiconductor wafer 334 can include a dielectric layer 109 formed on the surface of the processed semiconductor wafer 109 with at least one exposed metal pad 108. In other implementations, the dielectric layer 109 and/or the at least one metal pad 108 are formed subsequent to receiving the processed semiconductor wafer 334. The metal pad 108 can be pre-formed and exposed on the processed semiconductor wafer and integrated circuit die(s) 306. Forming a metal pad 308 can include using at least one suitable deposition technique, such as physical vapor deposition, chemical vapor deposition, molecular beam epitaxy, etc. Other techniques, such as lithography and etching may be utilized to form the metal pad 308. The metal pad 308 can include conductive material, such as copper and/or aluminum.

As shown in FIG. 3A, a first dielectric layer is formed on the surface of the processed semiconductor wafer (Block 206). In implementations, the first dielectric layer 310 can be deposited and/or formed over the dielectric layer 109 on the surface of the processed semiconductor wafer 334 and the metal pad(s) 308. The first dielectric layer 310 may be formed and/or deposited over the dielectric layer 109, the processed semiconductor wafer 334 and metal pad(s) 308 using, for example, one or more suitable deposition techniques, such as those discussed above. In one embodiment, forming the first dielectric layer 310 can include coating the first dielectric layer 310 on the dielectric layer 109, processed semiconductor wafer 334, and/or metal pads 308 using a spin coating process. In other embodiments, forming the first dielectric layer 310 can include using deposition techniques, such as physical vapor deposition and/or chemical vapor deposition. After deposition, the first dielectric layer 310 can be etched and/or exposed to at least partially expose the metal pad(s) 308 using lithography and/or etching techniques. In implementations, the first dielectric layer 310 may include a suitable dielectric material, such as benzocyclobutene polymer (BCB), polyimide (PI), polybenzoxazole (PBO), silicon dioxide (SiO2), etc. In one specific embodiment, forming the first dielectric layer 310 includes forming a layer of polybenzoxazole (PBO).

Figure 3B:
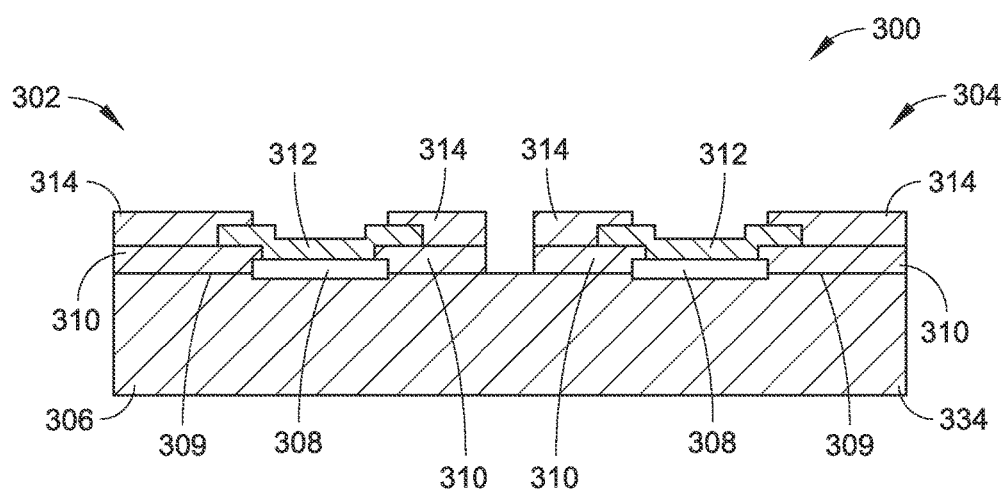
FIG. 3B is a diagrammatic partial cross-sectional side elevation view illustrating the fabrication of a wafer level package, such as the device shown in FIGS. 1A through 1D, in accordance with the process shown in FIG. 2.

As illustrated in FIG. 3B, a redistribution layer structure is formed on the metal pad and the first dielectric layer (Block 208). In implementations, forming a redistribution layer structure 312 includes depositing a conductive material (e.g., copper, aluminum, etc.) on the metal pad 308 and at least a portion of the first dielectric layer 310 and then selectively etching the deposited conductive material to form redistribution layer structure 312. In embodiments, suitable deposition processes may include sputtering, physical vapor deposition, electroplating, etc. Subsequent to deposition, the redistribution layer structure 312 may be etched as needed using lithography and/or etching techniques. In a specific embodiment, forming the redistribution layer structure 312 includes forming a thin titanium (Ti) barrier layer and a copper (Cu) seed onto the metal pad 308 and/or first dielectric layer 310 and further electroplating the copper seed to a desired thickness of copper. In some other embodiments, the barrier layer can include other materials, for example, a titanium/tungsten (Ti/W) layer. Further illustrated in FIG. 3B, a second dielectric layer is formed on the redistribution layer structure and the first dielectric layer (Block 210). In implementations, forming the second dielectric layer 314 may be similar to forming the first dielectric layer 310, such as using a spin coating process or another deposition technique, and lithography and etching.

The second dielectric layer 314 may be selectively etched to at least partially expose at least a portion of the redistribution layer structure 312. In one embodiment, the second dielectric layer 314 may be formed using a suitable dielectric material, such as benzocyclobutene polymer (BCB), Polyimide (PI), Polybenzoxazole (PBO), silicon dioxide (SiO2), and so forth.

Next, a pillar structure is formed on the redistribution layer structure (Block 212). In some implementations, the pillar structure 316 may be formed via a suitable copper plating process. In one embodiment using a plating step, forming the pillar structure 316 includes forming a thin barrier layer of titanium (other materials can also be used, such as titanium/tungsten) and a copper seed layer, and then electroplating the copper seed layer to a desired thickness. The size, shape, and dimensions of the pillar structure 316 may vary according to the various design/fabrication considerations of the wafer-level package device 100. In one embodiment, the pillar structure 316 may be formed using a plating process and then selectively etched to form a conductive pillar structure.

Figure 3C:
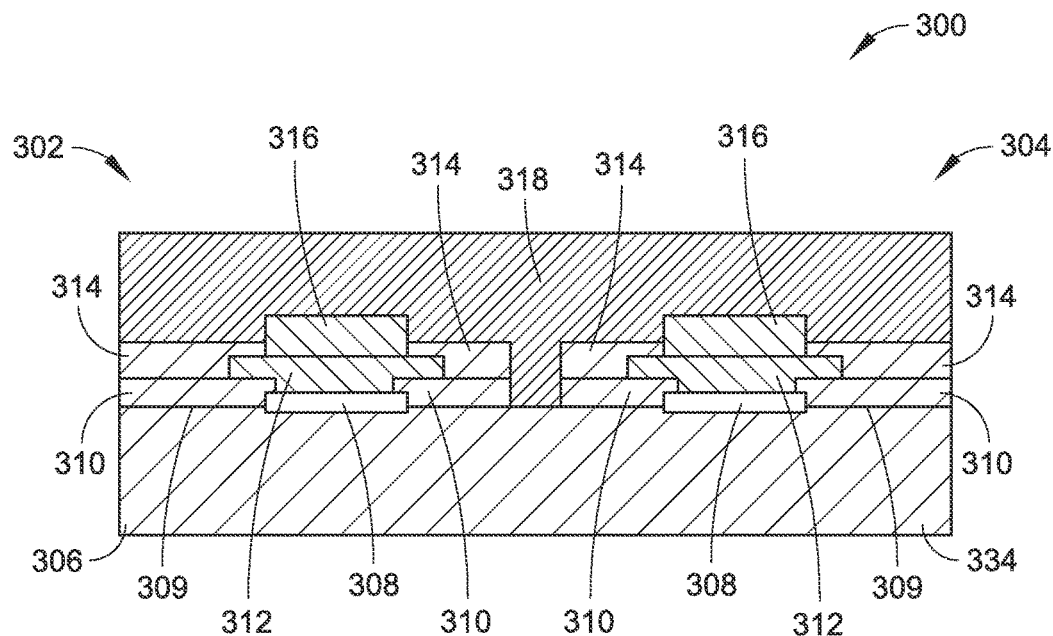
FIG. 3C is a diagrammatic partial cross-sectional side elevation view illustrating the fabrication of a wafer level package, such as the device shown in FIGS. 1A through 1D, in accordance with the process shown in FIG. 2.
Figure 3D:
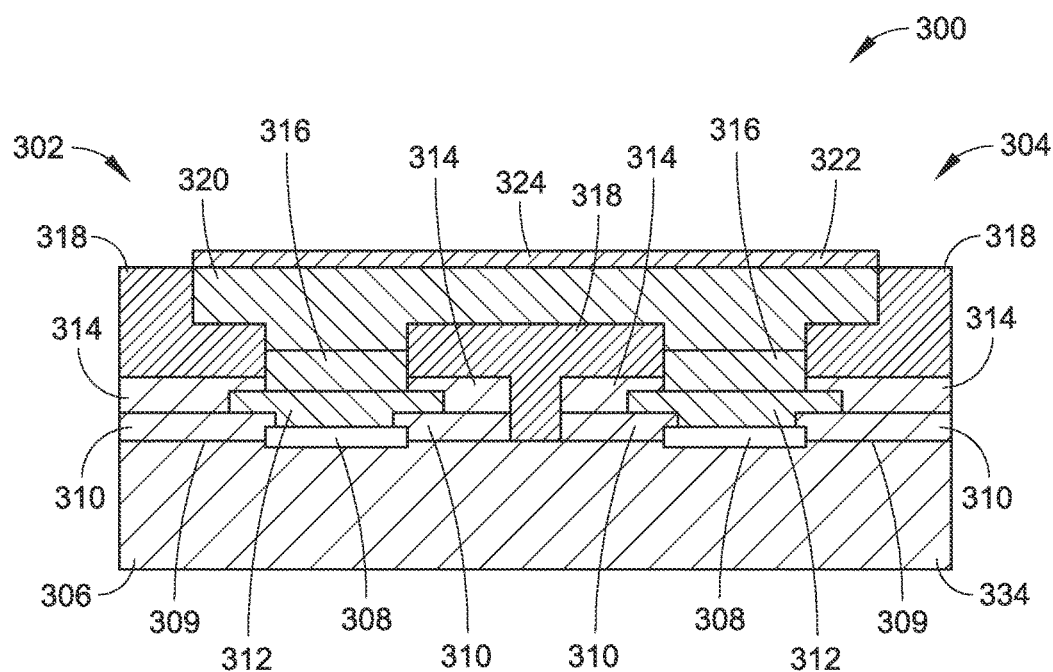
FIG. 3D is a diagrammatic partial cross-sectional side elevation view illustrating the fabrication of a wafer level package, such as the device shown in FIGS. 1A through 1D, in accordance with the process shown in FIG. 2.

A pillar layer is formed on the pillar structure (Block 214). In implementations, the pillar layer 320 can be formed on the pillar structure 316 such that the pillar layer 320 extends from a first pillar structure to a second pillar structure or between multiple pillar structures, as illustrated in FIG. 3D. The pillar layer 320 can be deposited or formed in a similar fashion to forming the pillar structure 316 by using deposition and/or plating techniques. In one specific implementation, forming the pillar layer 320 includes forming a thin titanium barrier layer and copper seed layer and subsequently electroplating the copper seed layer to a desired thickness of copper. In another embodiment, forming the pillar layer 320 can include using physical deposition, lithography, and/or etching techniques. Additionally, the pillar layer 320 can be pre-formed and subsequently placed on and coupled to the pillar structure 316 and wafer level package device 300. The pillar layer 320 may be formed such that a saw street 324 can transverse the formed pillar layer 324 resulting in an exposed lead tip in a singulated wafer level package device 100.

A molding layer is formed (Block 216). In implementations, a molding layer 318 is formed on and/or surrounding the second dielectric layer 314, the pillar structure 316, the pillar layer 320, and/or the integrated circuit die 306. As illustrated in FIGS. 3C and 3D, forming the second dielectric layer 314 can include forming around and covering the pillar layer 320 with a molding material. In one embodiment, the molding layer 318 may be formed before the pillar layer 320 is formed. In another embodiment, the molding layer 318 may be formed subsequent to the formation of the pillar layer 320. In some implementations, forming the molding layer 318 can include using processes such as compression molding, transfer molding, selective encapsulation, injection molding, and/or other encapsulation and/or molding processes. In some embodiments, the molding material can include, epoxy-based materials, silicone, and/or polyurethane, for example. Generally, molding layer 318 can include an insulating material configured to provide mechanical and environmental protection to the wafer level package device 100. In a specific embodiment, forming a molding layer 318 includes is molding with epoxy. Encapsulating the pillar structure 316 and/or the pillar layer 320 can function to protect the wafer level package device 100 and electrically insulate the integrated circuit device 302. In implementations, the molding layer 118 is formed such that at least a portion of the pillar layer 320 is exposed.

Then, a plating layer is formed on an exposed pillar layer surface (Block 218). In implementations, forming the plating layer 322 on the pillar layer 320 includes using a process such as deposition (e.g., sputtering, physical vapor deposition, etc.). In other implementations, forming the plating layer 322 can include printing and/or painting the plating layer 322. In yet other implementations, forming the plating layer 322 can include using a plating process. In implementations, forming the plating layer 322 can include forming a material suitable for adhering to a solder material while remaining conductive. In some embodiments, the plating layer 322 can include a Tin-Silver-Copper (Sn—Ag—Cu) alloy (i.e., SAC), a Tin-Silver (Sn—Ag) alloy, a Tin-Copper (Sn—Cu) alloy, copper, aluminum, etc.

Figure 3E:
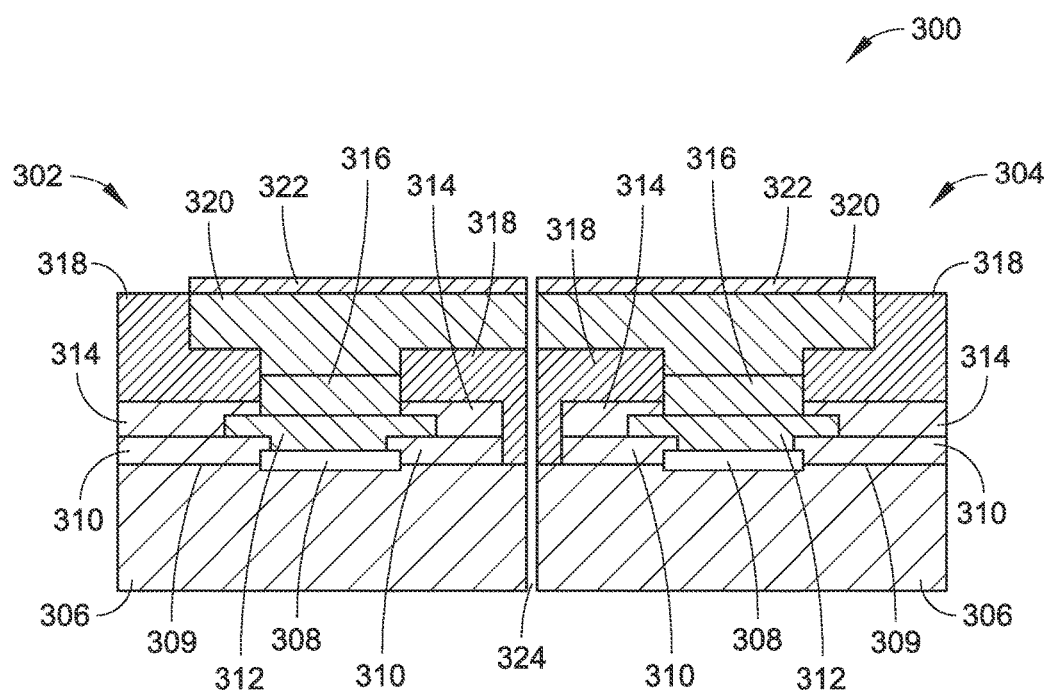
FIG. 3E is a diagrammatic partial cross-sectional side elevation view illustrating the fabrication of a wafer level package, such as the device shown in FIGS. 1A through 1D, in accordance with the process shown in FIG. 2.

Following the formation of the plating layer, the processed semiconductor wafer and integrated circuits may be singulated (Block 220). In implementations, singulating the processed semiconductor wafer and/or each integrated circuit die 306 can include using a dicing saw. In one embodiment and as shown in FIG. 3E, singulating an integrated circuit die 306 can include using a dicing saw to cut through at least the plating layer 322, the pillar layer 320, molding layer 318, and/or processed semiconductor wafer 334. In implementations, the wafer level package device 100 can be singulated and cut along a saw street 324, which transverses the plating layer 322 and/or the pillar layer 320. In implementations, a dicing saw, such as that used for singulating the processed semiconductor wafer can be equipped with a circular, diamond-plated dicing blade. In this step, the processed semiconductor wafer 334 can be mounted in a frame and placed under the dicing saw, in some embodiments with the blades rotating from about 30,000 RPM to 60,000 RPM to cut along the saw 124 street while using a dicing fluid/water mixture. Cutting through the pillar layer 320 results in exposed lead tips, which provides an additional solder-adhering surface that is configured to facilitate a solder fillet and/or a solder buttress.

Following fabrication of the wafer level package device 100, the wafer level package device 100 may be further processed and/or coupled with a printed circuit board 130 or other substrate to form an electronic device 132, which may be used in other systems, such as mobile phones and/or computing systems. In an implementation the wafer level package device 100 can be attached to a printed circuit board 130 using solder. In this implementation, the solder connection 126 can attach/adhere to the plating layer 324 and the exposed side of the pillar layer 320 subsequent to singulation and a cutting process, which can form a solder fillet and a solder buttress structure resulting in improved board level reliability.

Conclusion

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:

1. A wafer level package device, comprising:
   a processed semiconductor wafer including at least one integrated circuit die;
   a metal pad disposed on the at least one integrated circuit die;
   a first dielectric layer disposed on the at least one integrated circuit die and at least a portion of the metal pad;
   a redistribution layer at least partially formed on the metal pad and the first dielectric layer;
   a second dielectric layer disposed on the first dielectric layer and a portion of the redistribution layer;
   a pillar structure formed on the redistribution layer;
   a molding layer formed at least partially on the second dielectric layer;
   a sawn pillar layer formed on and abutting the pillar structure, where the sawn pillar layer overlaps the pillar structure and is a partial cantilever configuration, and where the sawn pillar layer forms an exposed lead tip; and
   a plating layer formed on the sawn pillar layer, where two sides of the sawn pillar layer are configured to adhere to a solder connection, the solder connection forming a solder fillet.

2. The wafer level package device of claim 1, wherein the metal pad disposed on the at least one integrated circuit die includes aluminum.

3. The wafer level package device of claim 1, wherein at least one of the first dielectric layer or the second dielectric layer includes a polybenzoxazole material.

4. The wafer level package device of claim 1, wherein at least one of the first dielectric layer or the second dielectric layer includes a polyimide material.

5. The wafer level package device of claim 1, wherein at least one of the pillar structure or the pillar layer includes copper.

6. The wafer level package device of claim 1, wherein the pillar structure includes a barrier material.

7. The wafer level package device of claim 1, the molding layer includes an epoxy-based material.

8. The wafer level package device of claim 1, wherein the plating layer formed on the pillar includes tin.

9. An electronic device, comprising:
   a printed circuit board; and
   a singulated wafer level package device coupled to the printed circuit board using at least one solder connection including a solder fillet, the wafer level package including a processed semiconductor wafer including at least one integrated circuit die;
   a metal pad disposed on the at least one integrated circuit die;
   a first dielectric layer disposed on the at least one integrated circuit die and at least a portion of the metal pad;
   a redistribution layer at least partially formed on the metal pad and the first dielectric layer;
   a second dielectric layer disposed on the first dielectric layer and a portion of the redistribution layer;
   a pillar structure formed on the redistribution layer;
   a molding layer formed at least partially on the second dielectric layer;
   a sawn pillar layer formed on and abutting the pillar structure, where the sawn pillar layer overlaps the pillar structure and is a partial cantilever configuration, and where the sawn pillar layer forms an exposed lead tip; and
   a plating layer formed on the sawn pillar layer, where two sides of the sawn pillar layer are configured to adhere to the at least one solder connection, the at least one solder connection including the solder fillet.

10. The electronic device of claim 9, wherein the metal pad disposed on the at least one integrated circuit die includes aluminum.

11. The electronic device of claim 9, wherein at least one of the first dielectric layer or the second dielectric layer includes a polybenzoxazole material.

12. The electronic device of claim 9, wherein at least one of the first dielectric layer or the second dielectric layer includes a polyimide material.

13. The electronic device of claim 9, wherein at least one of the pillar structure or the pillar layer includes copper.

14. The electronic device of claim 9, wherein the pillar structure includes a barrier material.

15. The electronic device of claim 9, the molding layer includes an epoxy-based material.

16. The electronic device of claim 9, wherein the plating layer formed on the pillar layer includes tin.

17. The electronic device of claim 9, further comprising a solder buttress structure coupled to a solder pad of the printed circuit board and coupled to at least part of an exposed lead tip of the wafer level package.

* * * * *